United States Patent
Khoury et al.

(10) Patent No.: US 8,508,981 B2
(45) Date of Patent: *Aug. 13, 2013

(54) APPARATUS FOR VARIABLE RESISTIVE MEMORY PUNCHTHROUGH ACCESS METHOD

(75) Inventors: Maroun Georges Khoury, Burnsville, MN (US); Hongyue Liu, Maple Grove, MN (US); Brian Lee, Eden Prairie, MN (US); Andrew John Gjevre Carter, Minneapolis, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/478,174

(22) Filed: May 23, 2012

(65) Prior Publication Data
US 2012/0230084 A1 Sep. 13, 2012

Related U.S. Application Data

(60) Continuation of application No. 13/042,508, filed on Mar. 8, 2011, now Pat. No. 8,199,558, which is a division of application No. 12/944,790, filed on Nov. 12, 2010, now Pat. No. 8,098,510, which is a continuation of application No. 12/904,288, filed on Oct. 14, 2010, now Pat. No. 7,961,497, which is a division of application No. 12/261,296, filed on Oct. 30, 2008, now Pat. No. 7,936,583.

(51) Int. Cl.
*G11C 11/00* (2006.01)

(52) U.S. Cl.
USPC ............ 365/148; 365/171; 365/173; 365/158

(58) Field of Classification Search
USPC .................... 365/148, 171, 173, 158, 185.18
See application file for complete search history.

(56) References Cited

U.S. PATENT DOCUMENTS

| | | |
|---|---|---|
| 3,982,233 A | 9/1976 | Crookshanks |
| 3,982,235 A | 9/1976 | Bennett |
| 4,160,988 A | 7/1979 | Russell |
| 4,232,057 A | 11/1980 | Ray |
| 4,247,915 A | 1/1981 | Bartlett |

(Continued)

FOREIGN PATENT DOCUMENTS

| | | |
|---|---|---|
| DE | 102008026432 | 12/2009 |
| EP | 1329895 | 7/2003 |

(Continued)

OTHER PUBLICATIONS

Adee, S., "Quantum Tunneling Creates Fast Lane for Wireless", IEEE Spectrum, Oct. 2007.

(Continued)

*Primary Examiner* — David Lam
(74) *Attorney, Agent, or Firm* — Mueting Raasch & Gebhardt PA

(57) ABSTRACT

Variable resistive punchthrough access methods are described. The methods include switching a variable resistive data cell from a high resistance state to a low resistance state by passing a write current through the magnetic tunnel junction data cell in a first direction. The write current is provided by a transistor being electrically coupled to the variable resistive data cell and a source line. The write current passes through the transistor in punchthrough mode.

20 Claims, 5 Drawing Sheets

(56) References Cited

U.S. PATENT DOCUMENTS

| | | |
|---|---|---|
| 4,323,589 A | 4/1982 | Ray |
| 4,576,829 A | 3/1986 | Kaganowicz |
| 5,083,190 A | 1/1992 | Pfiester |
| 5,135,878 A | 8/1992 | Bartur |
| 5,278,636 A | 1/1994 | Williams |
| 5,330,935 A | 7/1994 | Dobuzinsky |
| 5,365,083 A | 11/1994 | Tada |
| 5,412,246 A | 5/1995 | Dobuzinsky |
| 5,443,863 A | 8/1995 | Neely |
| 5,580,804 A | 12/1996 | Joh |
| 5,614,430 A | 3/1997 | Liang |
| 5,739,564 A | 4/1998 | Kosa |
| 5,872,052 A | 2/1999 | Iyer |
| 5,913,149 A | 6/1999 | Thakur |
| 5,923,948 A | 7/1999 | Cathey, Jr. |
| 5,926,412 A | 7/1999 | Evans |
| 5,929,477 A | 7/1999 | McAllister |
| 6,011,281 A | 1/2000 | Nunokawa |
| 6,013,548 A | 1/2000 | Burns |
| 6,034,389 A | 3/2000 | Burns |
| 6,077,745 A | 6/2000 | Burns |
| 6,100,166 A | 8/2000 | Sakaguchi |
| 6,114,211 A | 9/2000 | Fulford |
| 6,121,642 A | 9/2000 | Newns |
| 6,121,654 A | 9/2000 | Likharev |
| 6,165,834 A | 12/2000 | Agarwal |
| 6,300,205 B1 | 10/2001 | Fulford |
| 6,341,085 B1 | 1/2002 | Yamagami |
| 6,346,477 B1 | 2/2002 | Kaloyeros |
| 6,376,332 B1 | 4/2002 | Yanagita |
| 6,448,840 B2 | 9/2002 | Kao |
| 6,534,382 B1 | 3/2003 | Sakaguchi |
| 6,617,642 B1 | 9/2003 | Georgesca |
| 6,624,463 B2 | 9/2003 | Kim |
| 6,653,704 B1 | 11/2003 | Gurney |
| 6,667,900 B2 | 12/2003 | Lowrey |
| 6,750,540 B2 | 6/2004 | Kim |
| 6,753,561 B1 | 6/2004 | Rinerson et al. |
| 6,757,842 B2 | 6/2004 | Harari |
| 6,781,176 B2 | 8/2004 | Ramesh |
| 6,789,689 B1 | 9/2004 | Beale |
| 6,800,897 B2 | 10/2004 | Baliga |
| 6,842,368 B2 | 1/2005 | Hayakawa |
| 6,917,539 B2 | 7/2005 | Rinerson |
| 6,927,170 B2 | 8/2005 | Zheng |
| 6,940,742 B2 | 9/2005 | Yamamura |
| 6,944,052 B2 | 9/2005 | Subramanian |
| 6,979,863 B2 | 12/2005 | Ryu |
| 7,009,877 B1 | 3/2006 | Huai |
| 7,045,840 B2 | 5/2006 | Tamai |
| 7,051,941 B2 | 5/2006 | Yui |
| 7,052,941 B2 | 5/2006 | Lee |
| 7,098,494 B2 | 8/2006 | Pakala |
| 7,130,209 B2 | 10/2006 | Reggiori |
| 7,161,861 B2 | 1/2007 | Gogl |
| 7,180,140 B1 | 2/2007 | Brisbin |
| 7,187,577 B1 | 3/2007 | Wang |
| 7,190,616 B2 | 3/2007 | Forbes |
| 7,200,036 B2 | 4/2007 | Bessho |
| 7,215,568 B2 | 5/2007 | Liaw |
| 7,218,550 B2 | 5/2007 | Schwabe |
| 7,224,601 B2 | 5/2007 | Panchula |
| 7,233,537 B2 | 6/2007 | Tanizaki |
| 7,236,394 B2 | 6/2007 | Chen |
| 7,247,570 B2 | 7/2007 | Thomas |
| 7,272,034 B1 | 9/2007 | Chen |
| 7,272,035 B1 | 9/2007 | Chen |
| 7,273,638 B2 | 9/2007 | Belyansky |
| 7,274,067 B2 | 9/2007 | Forbes |
| 7,282,755 B2 | 10/2007 | Pakala |
| 7,285,812 B2 | 10/2007 | Tang |
| 7,286,395 B2 | 10/2007 | Chen |
| 7,289,356 B2 | 10/2007 | Diao |
| 7,345,912 B2 | 3/2008 | Luo |
| 7,362,618 B2 | 4/2008 | Harari |
| 7,378,702 B2 | 5/2008 | Lee |
| 7,379,327 B2 | 5/2008 | Chen |
| 7,381,595 B2 | 6/2008 | Joshi |
| 7,382,024 B2 | 6/2008 | Ito |
| 7,397,713 B2 | 7/2008 | Harari |
| 7,413,480 B2 | 8/2008 | Thomas |
| 7,414,908 B2 | 8/2008 | Miyatake |
| 7,416,929 B2 | 8/2008 | Mazzola |
| 7,432,574 B2 | 10/2008 | Nakamura |
| 7,440,317 B2 | 10/2008 | Bhattacharyya |
| 7,465,983 B2 | 12/2008 | Eldridge |
| 7,470,142 B2 | 12/2008 | Lee |
| 7,470,598 B2 | 12/2008 | Lee |
| 7,502,249 B1 | 3/2009 | Ding |
| 7,515,457 B2 | 4/2009 | Chen |
| 7,542,356 B2 | 6/2009 | Lee |
| 7,646,629 B2 | 1/2010 | Hamberg et al. |
| 7,660,148 B2 | 2/2010 | Yokoi |
| 7,697,322 B2 | 4/2010 | Leuschner |
| 7,732,881 B2 | 6/2010 | Wang |
| 7,738,279 B2 | 6/2010 | Siesazeck |
| 7,869,257 B2 * | 1/2011 | Philipp et al. ............... 365/148 |
| 7,936,583 B2 | 5/2011 | Khoury |
| 8,098,510 B2 * | 1/2012 | Khoury et al. ............... 365/148 |
| 2001/0046154 A1 | 11/2001 | Forbes |
| 2002/0081822 A1 | 6/2002 | Yanageta |
| 2002/0135955 A1 | 9/2002 | Ono |
| 2002/0136047 A1 | 9/2002 | Scheuerlein |
| 2003/0045064 A1 | 3/2003 | Kunikiyo |
| 2003/0168684 A1 | 9/2003 | Pan |
| 2003/0184918 A1 | 10/2003 | Lin |
| 2003/0235016 A1 | 12/2003 | Gill |
| 2004/0021189 A1 | 2/2004 | Yoda |
| 2004/0084725 A1 | 5/2004 | Nishiwaki |
| 2004/0114413 A1 | 6/2004 | Parkinson |
| 2004/0114438 A1 | 6/2004 | Morimoto |
| 2004/0249428 A1 | 12/2004 | Wang |
| 2004/0257878 A1 | 12/2004 | Morikawa |
| 2004/0262635 A1 | 12/2004 | Lee |
| 2005/0018476 A1 | 1/2005 | Kamijima |
| 2005/0044703 A1 | 3/2005 | Liu |
| 2005/0092526 A1 | 5/2005 | Fielder |
| 2005/0122768 A1 | 6/2005 | Fukumoto |
| 2005/0145947 A1 | 7/2005 | Russ |
| 2005/0174821 A1 | 8/2005 | Zheng |
| 2005/0201022 A1 | 9/2005 | Homg |
| 2005/0218521 A1 | 10/2005 | Lee |
| 2005/0237787 A1 | 10/2005 | Huai |
| 2005/0253143 A1 | 11/2005 | Takaura |
| 2005/0280042 A1 | 12/2005 | Lee |
| 2005/0280061 A1 | 12/2005 | Lee |
| 2005/0280154 A1 | 12/2005 | Lee |
| 2005/0280155 A1 | 12/2005 | Lee |
| 2005/0280156 A1 | 12/2005 | Lee |
| 2005/0282356 A1 | 12/2005 | Lee |
| 2006/0073652 A1 | 4/2006 | Pellizzer |
| 2006/0077707 A1 | 4/2006 | Deak |
| 2006/0131554 A1 | 6/2006 | Joung |
| 2006/0275962 A1 | 12/2006 | Lee |
| 2007/0007536 A1 | 1/2007 | Hidaka |
| 2007/0077694 A1 | 4/2007 | Lee |
| 2007/0096229 A1 | 5/2007 | Yoshikawa |
| 2007/0105241 A1 | 5/2007 | Leuschner |
| 2007/0113884 A1 | 5/2007 | Kensey |
| 2007/0115749 A1 | 5/2007 | Gilbert |
| 2007/0253245 A1 | 11/2007 | Ranjan |
| 2007/0279968 A1 | 12/2007 | Luo |
| 2007/0281439 A1 | 12/2007 | Bedell |
| 2007/0297223 A1 | 12/2007 | Chen |
| 2008/0007993 A1 | 1/2008 | Saitoh |
| 2008/0025083 A1 | 1/2008 | Okhonin |
| 2008/0029782 A1 | 2/2008 | Carpenter |
| 2008/0032463 A1 | 2/2008 | Lee |
| 2008/0037314 A1 | 2/2008 | Ueda |
| 2008/0038902 A1 | 2/2008 | Lee |
| 2008/0048327 A1 | 2/2008 | Lee |
| 2008/0094873 A1 | 4/2008 | Lai |
| 2008/0108212 A1 | 5/2008 | Moss |
| 2008/0144355 A1 | 6/2008 | Boeve |

| | | | |
|---|---|---|---|
| 2008/0170432 A1 | 7/2008 | Asao | |
| 2008/0191312 A1 | 8/2008 | Oh | |
| 2008/0219044 A1 | 9/2008 | Yoon | |
| 2008/0261380 A1 | 10/2008 | Lee | |
| 2008/0265360 A1 | 10/2008 | Lee | |
| 2008/0273380 A1 | 11/2008 | Diao | |
| 2008/0310213 A1 | 12/2008 | Chen | |
| 2008/0310219 A1 | 12/2008 | Chen | |
| 2009/0014719 A1 | 1/2009 | Shimizu | |
| 2009/0040855 A1 | 2/2009 | Luo | |
| 2009/0052225 A1 | 2/2009 | Morimoto | |
| 2009/0072246 A1 | 3/2009 | Genrikh | |
| 2009/0072279 A1 | 3/2009 | Moselund | |
| 2009/0161408 A1 | 6/2009 | Tanigami | |
| 2009/0162979 A1 | 6/2009 | Yang | |
| 2009/0185410 A1 | 7/2009 | Huai | |
| 2009/0296449 A1 | 12/2009 | Slesazeck | |
| 2010/0007344 A1 | 1/2010 | Guo | |
| 2010/0067281 A1 | 3/2010 | Xi | |
| 2010/0078620 A1 | 4/2010 | Xi | |
| 2010/0110756 A1 | 5/2010 | Khoury | |
| 2010/0142256 A1 | 6/2010 | Kumar | |
| 2010/0149856 A1 | 6/2010 | Tang | |

FOREIGN PATENT DOCUMENTS

| | | |
|---|---|---|
| WO | WO 0062346 | 10/2000 |
| WO | WO 0215277 | 2/2002 |
| WO | WO 2005/124787 | 12/2005 |
| WO | WO 2006/100657 | 9/2006 |
| WO | WO 2007/100626 | 9/2007 |
| WO | WO 2007/128738 | 11/2007 |

OTHER PUBLICATIONS

Berger et al., Merged-Transitor Logic (MTL)—A Low-Cost Bipolar Logic Concept, Solid-State Circuits, IEEE Journal, vol. 7, Issue 5, pp. 340-346 (2003).

Chung et al., A New SOI Inverter for Low Power Applications, Proceedings 1996 IEEE International SOI Conference, Oct. 1996.

Giacomini, R., et al., Modeling Silicon on Insulator MOS Transistors with Nonrectangular-Gate Layouts, Journal of the Electrochemical Society, 2006, pp. G218-G222, vol. 153, No. 3.

Hosomi et al., A Novel Nonvolatile Memory with Spin Torque Transfer Magnetization Switching: Spin-RAM, 2005 IEEE.

Hwang et al., Degradation of MOSFET's Drive Current Due to Halo Ion Implantation, Electron Devices Meeting, 1996, International Date: Dec. 8-11, 1996, pp. 567-570.

Internet website www.en.wikipedia.org/wiki/High-k dated Nov. 12, 2008.

Likharev, K., "Layered tunnel barrier for nonvolatile memory devices", Applied Physics Letters vol. 73, No. 15; Oct. 12, 1998.

Londergran et al., Interlayer Mediated Epitaxy of Cobalt Silicide on Silicon (100) from Low Temperature Chemical Vapor Deposition of Cobalt, Journal of the Electrochemical Society, 148 (1) C21-C27 (2001) C21.

PCT/ISA/210 Int'l. Search Report and PCT/ISA/237 Written Opinion for PCT/US2010/041134 from the EPO.

Romanyuk, A., et al., Temperature-induced metal-semiconductor transition in W-doped VO2 films studied by photoelectron spectroscopy, Solar Energy Materials and Solar Cells, 2007, pp. 1831-1835, No. 91, Elsevier, Switzerland.

Sayan, S., "Valence and conduction band offsets of a ZrO2/SiOxNy/n-Si CMOS gate stack: A combined photoemission and inverse photoemission study", Phys. Stat. Sol. (b) 241, No. 10, pp. 2246-2252 (2004).

Takato et al., High Performance CMOS Surrounding Gate Transistor (SGT) for Ultra High Density LSIs, Downloaded on Apr. 14, 2009 from IEEE Xplore, pp. 222-225.

U.S. Appl. No. 12/175,545, filed Jul. 18, 2008, Inventors: Lou et al.

U.S. Appl. No. 12/120,715, filed May 15, 2008, Inventors: Tian et al.

U.S. Appl. No. 12/498,661, filed Jul. 7, 2009, Inventor: Khoury.

U.S. Appl. No. 12/502,211, filed Jul. 13, 2009, Inventor: Lu.

Wang et al., Precision Control of Halo Implantation for Scaling-down ULSI Manufacturing, IEEE International Symposium on Sep. 13-15, 2005, pp. 204-207.

Zahler, James, et al., Wafer Bonding and Layer Transfer Processes for High Efficiency Solar Cells, NCPV and Solar Program Review Meeting, pp. 723-726, 2003.

* cited by examiner

APPARATUS FOR VARIABLE RESISTIVE MEMORY PUNCHTHROUGH ACCESS METHOD

CROSS-REFERENCE TO RELATED APPLICATIONS

This application is a continuation of Ser. No. 13/042,508 filed Mar. 8, 2011, now U.S. Pat. No. 8,1999,558, which is a divisional application of U.S. application Ser. No. 12/944,790 filed on Nov. 12, 2010, now U.S. Pat. No. 8,098,510, which is a continuation of U.S. application Ser. No. 12/904,288 filed on Oct. 14, 2010, now U.S. Pat. No. 7,961,497, which is a divisional application of U.S. application Ser. No. 12/261,296 filed on Oct. 30, 2008, now U.S. Pat. No. 7,936,583, the contents are hereby incorporated by reference in their entirety.

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~microsecond write and ~50-100 nanosecond read), limited endurance (~$10^3$-$10^5$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One challenge is that the transistor utilized to provide the write switching current is sized to accommodate the larger switching current and this increase in size limits the scaling of the memory devices.

BRIEF SUMMARY

The present disclosure relates to variable resistive memory punchthrough access methods. In particular, present disclosure relates to a spin-transfer torque memory that includes a transistor operating in punchthrough mode to assist in resistance state switching and methods of writing and reading the spin-transfer torque memory utilizing the transistor operating in punchthrough mode.

One illustrative method includes switching a variable resistive data cell from a high resistance state to a low resistance state by passing a write current through the variable resistive data cell in a first direction. The write current is provided by a transistor being electrically coupled to the variable resistive data cell and a source line. The write current passes through the transistor in punchthrough mode.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to variable resistive memory punchthrough access methods. In particular, present disclosure relates to a spin-transfer torque memory that includes a transistor operating in punchthrough mode to assist in resistance state switching and methods of writing and reading the spin-transfer torque memory utilizing the transistor operating in punchthrough mode. Thus, the transistor can conduct large write currents as compared to its size. While the present disclosure is not so limited, an appreciation of various aspects of the disclosure will be gained through a discussion of the examples provided below.

Variable resistive memory includes memory cells that switch between at least a low resistance data state and a high resistance data state by passing a write current through the resistive memory cell. In some embodiments the resistive memory cell is a phase change data cell such as, for example, a data cell that includes a chalcogenide material. In some embodiments the resistive memory is a magnetic tunnel junction such as, for example, a spin transfer torque memory cell. These magnetic tunnel junction data cells are further described below.

Figure 1:
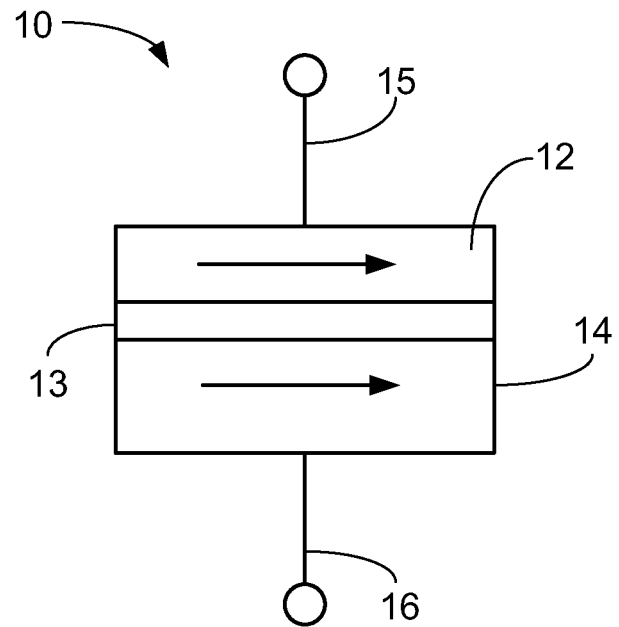
FIG. 1 is a cross-sectional schematic diagram of an illustrative magnetic tunnel junction memory cell in the low resistance state.
Figure 2:
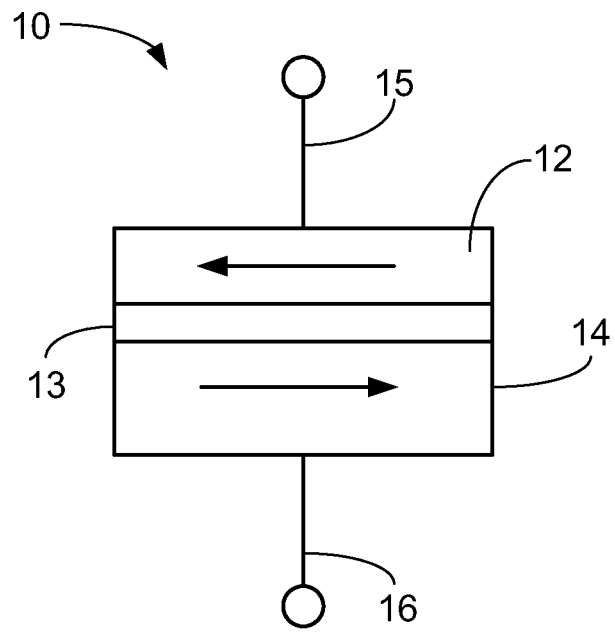
FIG. 2 is a cross-sectional schematic diagram of another magnetic tunnel junction memory cell in the high resistance state.

FIG. 1 is a cross-sectional schematic diagram of an illustrative magnetic tunnel junction data cell 10 in the low resistance state and FIG. 2 is a cross-sectional schematic diagram of another magnetic tunnel junction data cell 10 in the high resistance state. The magnetic tunnel junction data cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the magnetic tunnel junction data cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the magnetic tunnel junction data cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the magnetic tunnel junction data cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the magnetic tunnel junction data cell 10 via spin-transfer occurs when a current, passing through a magnetic layer of the magnetic tunnel junction data cell 10, becomes spin polarized and imparts a spin torque on the free layer 12 of the magnetic tunnel junction data cell 10. When a sufficient spin torque is applied to the free layer 12, the magnetization orientation of the free layer 12 can be switched between two opposite directions and accordingly the magnetic tunnel junction data cell 10 can be switched between the parallel state (i.e., low resistance state or "0" data state) and anti-parallel state (i.e., high resistance state or "1" data state) depending on the direction of the current.

The illustrative spin-transfer torque magnetic tunnel junction data cell 10 may be used to construct a memory device that includes multiple magnetic tunnel junction data cells in an array where a data bit is stored in magnetic tunnel junction data cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque magnetic tunnel junction data cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
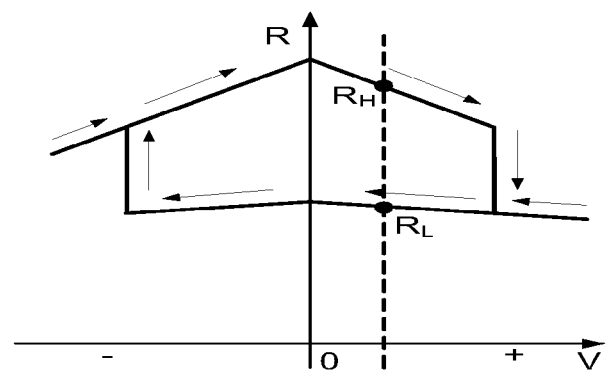
FIG. 3 is a graph of a static R-V (resistance-voltage) curve of a magnetic tunnel junction memory cell.

FIG. 3 is a graph of a static R-V sweep curve of a magnetic tunnel junction data cell. When applying a positive voltage on the second electrode 16 in FIG. 1 or 2, the MTJ 10 enters the positive applied voltage region in FIG. 3 and switches from the high resistance state (FIG. 2) to the low resistance state (FIG. 1). When applying a positive voltage on the first electrode 15 in FIG. 1 or 2, the magnetic tunnel junction data cell 10 enters the negative applied voltage region in FIG. 3. The resistance of the magnetic tunnel junction data cell switches from the low resistance state (FIG. 1) to the high resistance state (FIG. 2).

Let $R_H$ and $R_L$ denote the high and low magnet resistance, respectively. We define the Tunneling Magneto Resistance Ratio (TMR) as TMR=$(R_H-R_L)/R_L$. Here $R_H$, $R_L$ and TMR are determined by also the sensing current or voltage, as shown in FIG. 3. Generally, a large TMR makes it easier to distinguish the two resistance states of the magnetic tunnel junction data cell.

Figure 4:
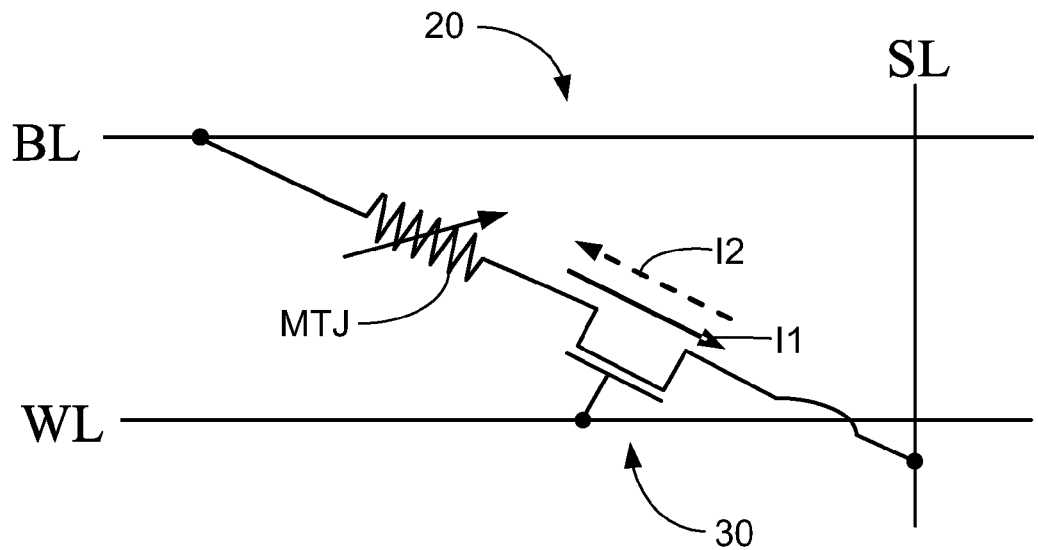
FIG. 4 is a schematic circuit diagram of an illustrative memory unit.
Figure 5:
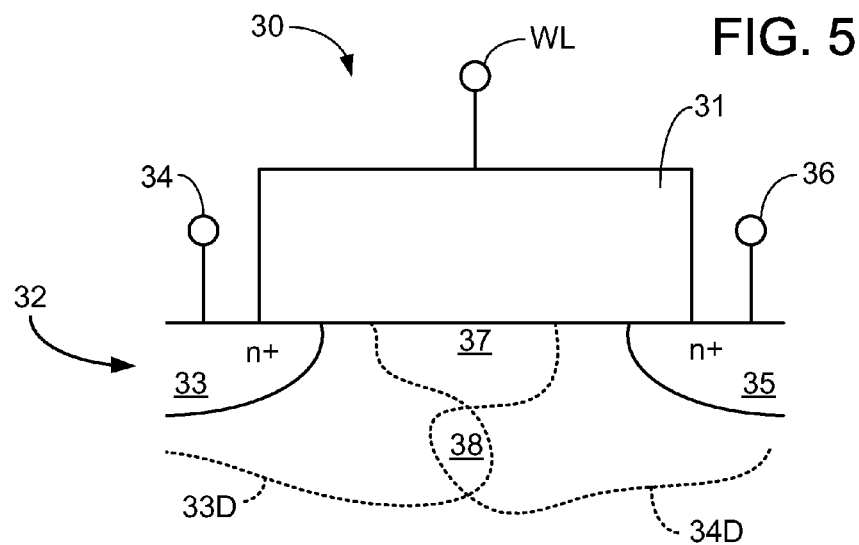
FIG. 5 is a schematic diagram of a transistor operating in punchthrough mode.

FIG. 4 is a schematic circuit diagram of a memory unit 20 and FIG. 5 is a schematic diagram of a transistor 30 operating in punchthrough mode. The memory unit 20 includes a variable resistive data cell (e.g., magnetic tunnel junction data cell MTJ) electrically coupled to a bit line BL and a source line SL. The variable resistive data cell or magnetic tunnel junction data cell MTJ is configured to switch between a high resistance state and a low resistance state by passing a write current through the data cell. A transistor 30 is electrically connected between the variable resistive data cell or MTJ and the source line SL. The transistor can be a metal-oxide-semiconductor field effect transistor (MOSFET). In many embodiments, the MOSFET is a NMOS or a PMOS transistor. In many embodiments, the transistor includes a gate contact that is in electrical connection to a word line WL.

In FIG. 5 the transistor 30 includes a gate 31, and in many embodiments the gate 31 is in electrical connection with the WL, although in some embodiments the gate 31 is not in electrical connection with the WL. The transistor 30 includes a semiconductor substrate 32 having a p or n doped source region 33 and drain region 35. The source region 33 is in electrical connection to a source electrode 34 and the drain region 35 is in electrical connection to a drain electrode 36. A channel region 37 separates the source region 33 and drain region 35. The transistor 30 is illustrated as being between the source line SL and the variable resistive data cell or magnetic tunnel junction data cell MTJ. However, the transistor 30 can be between the bit line BL and the variable resistive data cell or magnetic tunnel junction data cell MTJ. The transistor 30 operates as a bi-directional switch to allow read and write currents to flow through the variable resistive data cell or magnetic tunnel junction data cell MTJ.

The transistor 30 is configured to operate in punchthrough mode. Punchthrough mode occurs when a sufficient voltage is applied across the source region 33 and drain region 35 to merge a source depletion region 33D and a drain depletion region 34D. The merged area 38 allows the transistor 30 to conduct a large current from the source electrode 34 to the drain electrode 36. The transistor 30 allows punchthrough at relatively low voltages (known as the punchthrough voltage Vp). Current can flow in either direction through the transistor 30 in punchthrough mode. In punchthough mode, the gate of the transistor 30 is not activated by the word line WL. Thus, in some embodiments, the word line WL can be omitted from the memory unit 20.

Thus for example, the transistor 30 can provide a first data state write current I1 to the variable resistive data cell or magnetic tunnel junction data cell MTJ to switch the variable resistive data cell or magnetic tunnel junction data cell MTJ from a high resistance state to a low resistance state and the transistor 30 can provide a second data state current I2 to the variable resistive data cell or magnetic tunnel junction data cell MTJ to switch the variable resistive data cell or magnetic tunnel junction data cell MTJ from a low resistance state to a high resistance state or vice versa. The first data state write current I1 and the second data state current I2 flow through the transistor 30 in punchthrough mode. In many embodiments, first data state write current I1 has a similar or the same magnitude as the second data state current I2.

In some embodiments, the transistor (described throughout) is replaced with a bidirectional switch, where the material of the gate is polysilicon, metal or a dielectric such as, for example, silicon nitride or silicon oxide. In these embodiments, the read operation is accomplished via a short read cycle, as described below.

Figure 6:
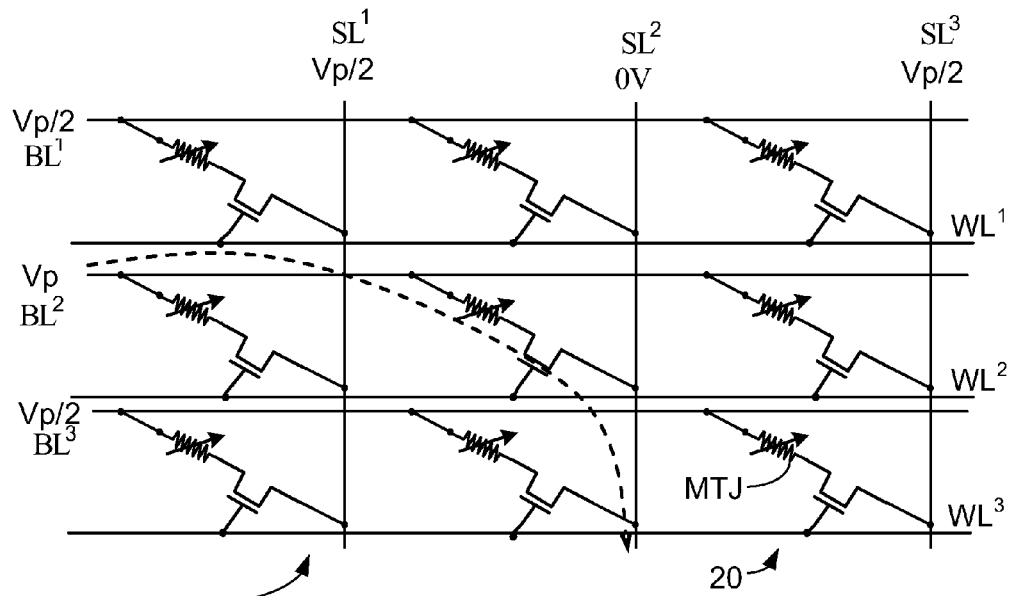
FIG. 6 is a schematic circuit diagram of writing a data state to a selected memory unit of a memory unit array.

FIG. 6 is a schematic circuit diagram of writing a data state to a selected memory unit of a memory unit array 40. The memory array 40 includes a plurality of bit lines $BL^1$, $BL^2$, $BL^3$ and a plurality of source lines $SL^1$, $SL^2$, $SL^3$ intersecting with the plurality of bit lines $BL^1$, $BL^2$, $BL^3$ and forming a cross-point array. The memory array 40 includes a plurality of word lines $WL^1$, $WL^2$, $WL^3$. While only three bit lines, source lines, and word lines are illustrated, it is understood that the memory unit array 40 can have any useful number of bit lines, source lines, and word lines.

A memory unit 20 (as described above) is adjacent to at least selected cross-points of the cross-point array. The memory unit 20 includes a magnetic tunnel junction data cell MTJ electrically coupled to a bit line $BL^1$, $BL^2$, or $BL^3$ and a source line $SL^1$, $SL^2$, or $SL^3$. The variable resistive data cell or magnetic tunnel junction data cell MTJ is configured to switch between a high resistance state and a low resistance state by passing a write current through the magnetic tunnel junction data cell, as described above.

A transistor 30 is electrically connected between the variable resistive data cell or magnetic tunnel junction data cell MTJ and the source line ($SL^3$ for the illustrated cross-point memory unit 20). The transistor 30 provides current to the variable resistive data cell or magnetic tunnel junction data cell MTJ in punchthrough mode, as described above.

FIG. 6 also illustrates a writing access method. The bit lines $BL^1$, $BL^2$, $BL^3$ and the source lines $SL^1$, $SL^2$, $SL^3$ are precharged to a specified precharge voltage level (Vp/2). This specified precharge voltage level can be any useful level. In many embodiments, the specified precharge voltage level is in a range 40 to 60% of the punchthrough voltage Vp, or about 50% of the punchthrough voltage Vp.

The selected memory unit 20 to write to is located at the intersection of $BL^2$ and $SL^2$. Thus, a punchthrough voltage Vp is applied across the selected memory unit 20 in a first direction (to write a first resistance state). In this example, the punchthrough voltage Vp is applied to the bit line $BL^2$ and the source line $SL^2$ is grounded. The precharge voltage is selected so that the voltage difference between any other (non-selected) two source lines or bit lines is always less than the punchthrough voltage Vp of the transistor 30. Therefore, current does not flow through any other transistor in the array 40. Switching the ground and punchthrough voltage Vp provides current in a second direction (to write a second resistance state) opposing the first direction.

Reading the memory unit 20 can be accomplished by activating the gate of the transistor 30 via the word line WL and allowing a read current to pass though the transistor 30 via an inversion layer between the source region and drain region of the transistor 30. Alternatively, the memory unit 20 can be read by conducting a current through the transistor 30 in punchthrough mode. In punchthrough reading mode, a punchthrough voltage Vp is applied across the transistor 30 and variable resistive data cell or magnetic tunnel junction data cell MTJ for a period of time that is not long enough to switch the data state of the variable resistive data cell or magnetic tunnel junction data cell MTJ.

Figure 7:
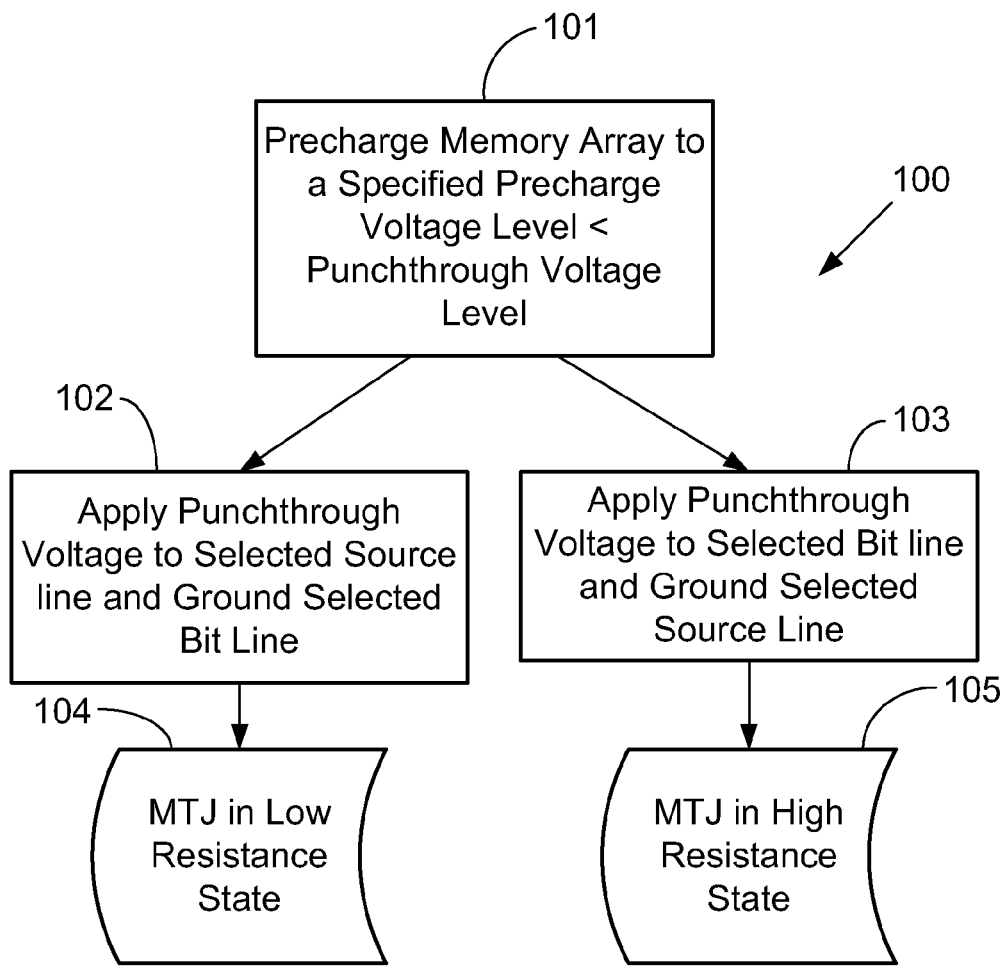
FIG. 7 is a flow diagram of an illustrative method of writing to a memory unit array.

FIG. 7 is a flow diagram of an illustrative method of writing to a memory unit array 100, described above. The method includes precharging the memory array to a specified precharge voltage level (less than the punch through voltage level) at block 101, as described above. If writing a low resistance state, then the punchthrough writing voltage Vp is applied to a selected source line and a selected bit line is grounded at block 102 to place the selected variable resistive data cell or MTJ in a low resistance state at data state 104. If writing a high resistance state, then the punchthrough writing voltage Vp is applied to a selected bit line and a selected source line is grounded at block 103 to place the selected variable resistive data cell or MTJ in a high resistance state at data state 105. In other embodiments, the data resistance states can be reversed based on the configuration of the variable resistive data cell or MTJ.

Figure 8:
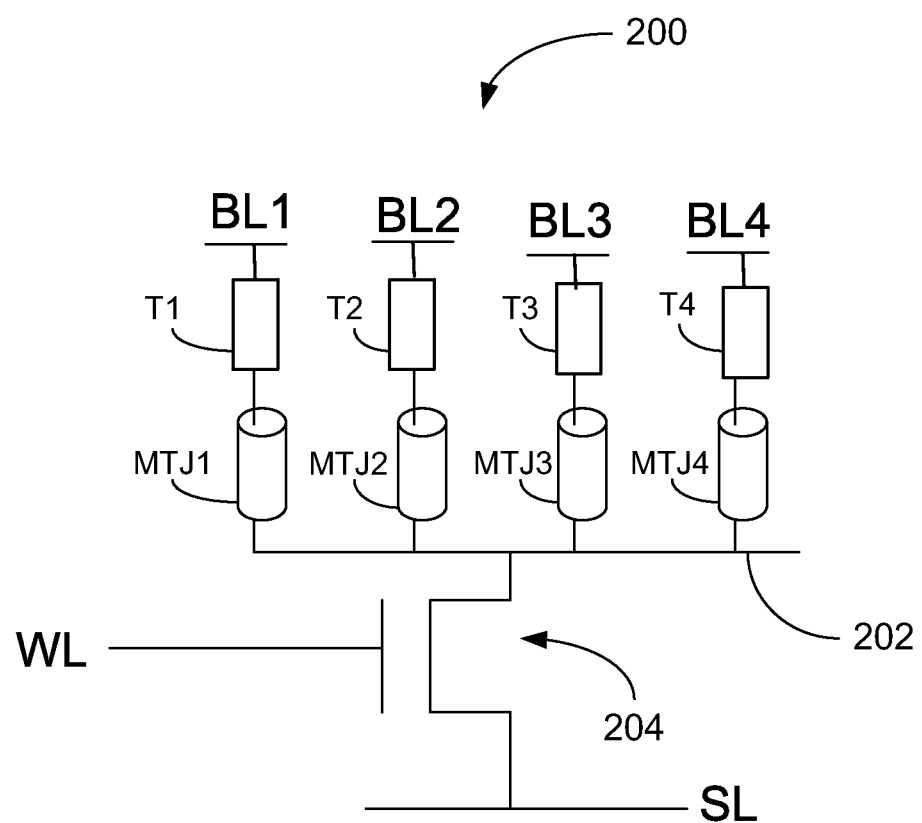
FIG. 8 is a schematic circuit diagram of another memory unit array.

FIG. 8 is a schematic circuit diagram of another memory unit array 200. The exemplary memory array 200 includes, at least, a first transistor T1 electrically connected between a first variable resistive data cell or first magnetic tunnel junction data cell MTJ1 and a first bit line BL1, and a second transistor T2 electrically connected between a second variable resistive data cell or second magnetic tunnel junction data cell MTJ2 and a second bit line BL2. The illustrated memory unit array 200 further includes a third transistor T3 electrically connected between a third variable resistive data cell or third magnetic tunnel junction data cell MTJ3 and a third bit line BL3, and a fourth transistor T4 electrically connected between a fourth variable resistive data cell or fourth magnetic tunnel junction data cell MTJ4 and a fourth bit line BL4. The memory array 200 can have any useful number of variable resistive data cells or magnetic tunnel junction data cells, as desired. For example, two bit lines, two transistors, and two variable resistive data cells could be used.

The variable resistive data cell or magnetic tunnel junction data cells are electrically connected to a common conductive line 202. A common transistor 204 electrically couples the common conductive line 202 to a source line SL. A word line WL activates a gate of the common transistor 204 to allow current to flow from the source line SL the selected bit line BL1, BL2, BL3, or BL4. A punchthrough voltage Vp (at least) is applied across, for example, a first bit line BL1 and the source line SL. Current does not flow into any of the other variable resistive data cell or magnetic tunnel junction data cells (i.e., MTJ2, MTJ3, MTJ4) since it takes at least two times the punchthrough voltage to punchthrough any of the other transistors (i.e., T2, T3, T4).

Thus, embodiments of the APPARATUS FOR VARIABLE RESISTIVE MEMORY PUNCHTHROUGH ACCESS METHOD are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method comprising:
applying a voltage across a source region and a drain region of a transistor that is sufficient to merge a source depletion region and a drain depletion region of the transistor and conduct a write current through the transistor;
switching a variable resistive data cell from a high resistance state to a low resistance state by passing the write current through the variable resistive data cell in a first direction.

2. The method according to claim 1, further comprising switching the variable resistive data cell from the low resistance state to the high resistance state by passing the write current through the variable resistive data cell in a second direction opposing the first direction.

3. The method according to claim 1, wherein the transistor is a NMOS transistor or a PMOS transistor.

4. The method according to claim 1, wherein the variable resistive data cell is a magnetic tunnel junction data cell.

5. The method according to claim 1, wherein the write current in the first direction has about the same magnitude as the write current in the second direction.

6. The method according to claim 3, wherein the magnetic tunnel junction data cell is a spin-transfer torque data cell.

7. The method according to claim 1, further comprising passing a read current through the variable resistive data cell by activating a gate of the transistor.

8. The method according to claim 1, further comprising passing a read current through the variable resistive data cell, the read current formed by applying a voltage across a source region and a drain region of a transistor that is sufficient to merge a source depletion region and a drain depletion region of the transistor and conduct the read current through the transistor.

9. The method according to claim 1, wherein the write current in the first direction and the write current in the second direction is formed by a voltage difference across a source region and drain region of the transistor having a magnitude equal to or greater than a punchthrough voltage for the transistor.

10. A method comprising:
switching a variable resistive data cell from a high resistance state to a low resistance state by passing a write current through the variable resistive data cell in a first direction, the write current passing through the transistor in punchthrough mode.

11. The method according to claim 10, further comprising switching the variable resistive data cell from the low resistance state to the high resistance state by passing the write current through the variable resistive data cell in a second direction opposing the first direction, the write current provided by the transistor operating in punchthrough mode.

12. The method according to claim 10, wherein the transistor is a NMOS transistor or a PMOS transistor.

13. The method according to claim 10, wherein the variable resistive data cell is a magnetic tunnel junction data cell.

14. The method according to claim 10, wherein the write current in the first direction has about the same magnitude as the write current in the second direction.

15. The method according to claim 13, wherein the magnetic tunnel junction data cell is a spin-transfer torque data cell.

16. The method according to claim 10, further comprising passing a read current through the variable resistive data cell by activating a gate of the transistor.

17. A method comprising:
applying a voltage across a source region and a drain region of a first transistor that is sufficient to merge a source depletion region and a drain depletion region of the first transistor and conduct a write current through the first transistor;
activating a common transistor to allow the write current to pass through the common transistor, the common transistor electrically coupled to a source line and the first variable resistive data cell, the common transistor electrically coupled to a second variable resistive data cell.

18. The method according to claim 17 wherein the first and second variable resistive data cells are spin-transfer torque data cells.

19. The method according to claim 17 wherein the write current selectively passes through the first and second variable resistive data cells.

20. The method according to claim 17 wherein the common transistor is electrically connected to three or more variable resistive data cells.

* * * * *